United States Patent
Manion et al.

(10) Patent No.: US 8,867,233 B2
(45) Date of Patent: *Oct. 21, 2014

(54) SMART METER PROTECTION SYSTEM AND METHODS

(75) Inventors: Holly Ellen Manion, Rancho Santa Fe, CA (US); Alfredo Rodriguez Pacheco, Jr., Encinitas, CA (US); John O'Melveny Woods, Kirkland, WA (US); James Joseph Fraley, Encinitas, CA (US)

(73) Assignee: EMF Safety, LLC, Rancho Santa Fe, CA (US)

(*) Notice: Subject to any disclaimer, the term of this patent is extended or adjusted under 35 U.S.C. 154(b) by 395 days.

This patent is subject to a terminal disclaimer.

(21) Appl. No.: 13/289,754

(22) Filed: Nov. 4, 2011

(65) Prior Publication Data

US 2012/0287596 A1    Nov. 15, 2012

Related U.S. Application Data

(63) Continuation-in-part of application No. 13/195,304, filed on Aug. 1, 2011.

(60) Provisional application No. 61/370,013, filed on Aug. 2, 2010, provisional application No. 61/382,848, filed on Sep. 14, 2010.

(51) Int. Cl.
*H05K 9/00* (2006.01)
*G01D 4/00* (2006.01)
*G01R 1/18* (2006.01)

(52) U.S. Cl.
CPC .............. *G01D 4/002* (2013.01); *Y04S 20/32* (2013.01); *H05K 9/0001* (2013.01); *Y02B 90/241* (2013.01); *G01R 1/18* (2013.01)
USPC .......................................... 361/816; 174/520

(58) Field of Classification Search
CPC ....... H09K 9/00; H09K 9/002; H09K 9/0039; H09K 1/0218
USPC .......................................... 361/816; 174/520
See application file for complete search history.

(56) References Cited

U.S. PATENT DOCUMENTS

| 4,491,792 | A  |   | 1/1985  | Bullock et al. |
|-----------|----|---|---------|----------------|
| 5,027,061 | A  | * | 6/1991  | Palmer et al. ................. 324/156 |
| 6,462,713 | B2 |   | 10/2002 | Porter et al. |
| 7,550,826 | B2 |   | 6/2009  | Orth et al. |
| 8,427,317 | B2 | * | 4/2013  | Hammad et al. ........... 340/572.1 |

(Continued)

OTHER PUBLICATIONS

Article; Weatherall, Martin; "The Danger of Smart Meters" Feb. 5, 2010.*
weepinitiative.org. The Danger of 'Smart Meters'/Propertyvalues/Dangerous/Alarmingreport/Cell Phone Cigarerrettes, http://weepnews.blogspot.com/2010/02/danger-of-meters-property-values.html, Feb. 5, 2010, 15 pages.
Smart Meter Shield Trademark, filed Jul. 23, 2010, 3 pages.
Mercury News. Readers: SmartMeters interfere with baby monitors, other household gadgets, http://forums.mercurynews.com/topic/readers-smartmeters-interfere-with-baby-monitors-other-household-gadgets, Sep. 7, 2010, 6 pages.

*Primary Examiner* — Timothy Thompson
*Assistant Examiner* — Charles Pizzuto
(74) *Attorney, Agent, or Firm* — Stephen C. Beuerle; Procopio Cory Hargreaves & Savitch LLP

(57) ABSTRACT

A smart meter protection system for decreasing intensity of radiation going into one's home from a smart meter associated with the building structure includes a redirection mechanism operably associable with the smart meter to partially enclose a smart meter so as to redirect radiation emitted from the smart meter away from the interior of the building structure.

19 Claims, 14 Drawing Sheets

(56) References Cited

U.S. PATENT DOCUMENTS

| | | |
|---|---|---|
| 2008/0068216 A1 | 3/2008 | Borisov et al. |
| 2008/0129536 A1 | 6/2008 | Randall et al. |
| 2010/0164750 A1 | 7/2010 | Mashhad et al. |
| 2010/0201516 A1 | 8/2010 | Gelvin et al. |
| 2012/0026715 A1* | 2/2012 | Manion et al. ............... 361/816 |

\* cited by examiner

SMART METER PROTECTION SYSTEM AND METHODS

CROSS-REFERENCE TO RELATED APPLICATION

This application is a continuation-in-part of U.S. nonprovisional patent application Ser. No. 13/195,304 filed on Aug. 1, 2011 and claims priority to U.S. provisional patent application 61/370,013 filed on Aug. 2, 2010 and U.S. provisional patent application 61/382,848 filed on Sep. 14, 2010 under 35 U.S.C. 119. All of these patent applications are incorporated by reference herein.

FIELD OF THE INVENTION

The present invention relates to Faraday shields, especially Faraday shields for smart meters and an antenna for RF energy redirection method.

BACKGROUND OF THE INVENTION

A smart meter is a digital electric, water, or gas meter that records consumption in intervals and communicates the information via a communications network (e.g., radio frequency (RF) mesh network) back to a utility company for monitoring and billing purposes (e.g., telemetering). The smart meter uses wireless technology (e.g., RF energy, HAN, Zigbee, Bluetooth, 3G, etc.) for communicating with the utility company. The smart meter can also shut off or suspend the delivery of these services, under any condition. The smart meter can also serviceload balancing, emergency, and now with electrical cars, higher voltages will be used in homes which can generate more noise.

There have been concerns about health problems linked to smart meters. These concerns are related to studies that there may be physiological damage caused by radio frequency energy transmissions. The World Health Organization (WHO)/International Agency for Research on Cancer (IARC) has classified non-ionizing radiofrequency radiation as possibly carcinogenic to humans (Group 2B). While there does not appear to be definitive studies that show that radio frequency energy causes physiological damage, it is well to be protected from such energy as a precaution.

SUMMARY OF THE INVENTION

An aspect of the present invention involves a smart meter protection system that provides a Faraday shield: which redirects the radio frequency (RF) energy emitted from the smart meter away from the interior of the building structure, living area, or where people frequent (e.g., house, condo, apartment, commercial structure, etc.), decreasing the intensity of the radiation emitted into the home, condo, apartment, or commercial structure, etc. and protecting the occupants from the majority of RF radiation while allowing the smart meter to perform its telemetering or communication functions. The solution we have described is an example of an invention where many of these components that make up this system can be used in concert or as a single component. As expected when the solution is used where every component is working in concert with each other, the benefits are maximized. However utilizing a single component (e.g., the focusing unit, smart meter protection device, smart meter protection panel) can also provide a beneficial outcome.

Another aspect of the present invention involves a smart meter protection system that includes a focuser unit redirection mechanism that circumferentially cuffs the smart meter. The focuser unit focuses emitted RF energy and, along with the rest of the smart meter protection system, decreases the intensity of the RF radiation being emitted by the smart meter into the interior of the building structure, living area, or where people frequent. This also prevents the user's home from being a transmitter for other smart meter signals.

A further aspect of the invention involves a smart meter protection system for decreasing the intensity of the radiation and the RF pulse energy emitted into the interior of the building structure, living area, or where people frequent from the smart meter and protecting the occupants of the interior of the building structure, living area, or where people frequent from the majority of RF radiation emitted from the smart meter while allowing the smart meter to perform its telemetering or communication functions. The smart meter protection system includes a redirection mechanism operably associable with the smart meter to partially enclose an outer surface area of the smart meter so as to redirect radiation emitted from the smart meter away from the interior of the building structure.

One or more implementations of the aspect of the invention described immediately above includes one or more of the following: the redirection mechanism includes at least one of a smart meter protection device, a smart meter protection panel, and a focuser unit; the RF energy redirection mechanism includes a smart meter protection device; the smart meter protection device includes an enclosure like, but not limited to, a rectangular box configuration; the smart meter protection device includes four closed sides and two open sides; one of the two open sides accommodates the smart meter and the other of the two open sides allows redirected radiation to egress there through away from the interior of the building structure, living area, or where people frequent; the smart meter protection device includes at least one opening that allows redirected radiation to egress there through away from the interior of the building structure, living area, or where people frequent; the redirection mechanism includes a smart meter protection device and a smart meter protection panel; the smart meter protection panel is operably associable with the smart meter between the smart meter and the interior of the building structure to redirect the radiation emitted from the smart meter away from the interior of the building structure, living area, or where people frequent; the redirection mechanism includes a smart meter protection device, a smart meter protection panel, and a focuser unit; the redirection mechanism includes a focuser unit; the redirection mechanism is a focuser unit; the smart meter includes an outer periphery and the focuser unit is a band that is operably associable with the smart meter for directly surrounding the outer periphery of the smart meter in a ring-like fashion; the band includes two open ends, and one of the two open ends accommodates the smart meter and the other of the two open ends allows redirected radiation to egress there through away from the interior of the building structure, living area, or where people frequent; the focuser unit includes at least one opening that allows redirected radiation to egress there through away from the interior of the building structure, living area, or where people frequent; the redirection mechanism includes a smart meter protection panel and focuser unit, and operably associating includes operably associating the focuser unit with the smart meter so that the focuser unit encloses the outer surface area of the smart meter and the smart meter protection panel is operably associating with the smart meter between the smart meter and the interior of the building structure to redirect radiation emitted from the smart meter away from the interior of the building structure; and/or the smart meter protection system includes grounding wire(s) to ground the smart meter protection system.

A still further aspect of the invention involves a method of using a smart meter protection system for decreasing the intensity of the radiation emitted into the interior of the building structure, living area, or where people frequent from the smart meter and protecting the occupants of the home from the majority of RF radiation emitted from the smart meter while allowing the smart meter to perform its telemetering or communication functions. The smart meter protection system includes a redirection mechanism operably associable with the smart meter to partially enclose an outer surface area of the smart meter so as to redirect radiation emitted from the smart meter away from the interior of the building structure, living area, or where people frequent.

The method includes providing the smart meter protection system described in the aspect of the invention described above; operably associating the smart meter protection system with the smart meter so that smart meter protection system partially encloses the outer surface area of the smart meter; and redirecting radiation emitted from the smart meter away from the interior of the building structure, living area, or where people frequent with the smart meter protection system.

One or more implementations of the aspect of the invention described immediately above includes one or more of the following: the redirection mechanism includes a smart meter protection device, and operably associating includes operably associating the smart meter protection device with the smart meter so that smart meter protection device partially encloses the outer surface area of the smart meter and redirects radiation emitted from the smart meter away from the interior of the building structure, living area, or where people frequent; the redirection mechanism includes a smart meter protection panel, and operably associating includes operably associating the smart meter protection panel with the smart meter between the smart meter and the interior of the building structure so that smart meter protection panel redirects the radiation emitted from the smart meter away from the interior of the building structure, living area, or where people frequent; the redirection mechanism includes a focuser unit that is a band, and operably associating includes directly surrounding the outer periphery of the smart meter in a ring-like fashion with the focuser unit so that the focuser unit partially encloses the outer surface area of the smart meter and redirects radiation emitted from the smart meter away from the interior of the building structure, living area, or where people frequent.

DETAILED DESCRIPTION OF PREFERRED EMBODIMENTS

Figure 1:
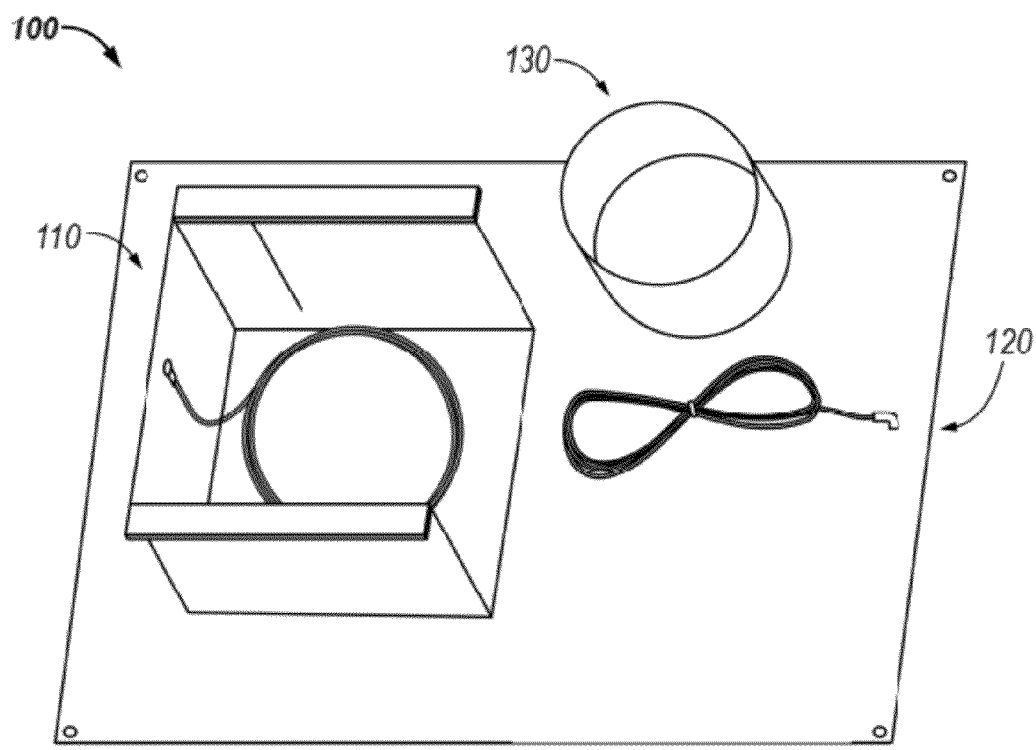
FIG. 1 is a perspective view of an embodiment of a smart meter protection system including the smart meter protection device, smart meter protection panel, and focuser unit illustrated in FIGS. 1-24.

With reference to FIGS. 1-24, an embodiment of a smart meter protection system 100, along with methods of making, applying, and using the smart meter protection system 100, will be described. The smart meter protection system 100 provides a Faraday cage, Faraday shield or Hoffman Box for a smart meter 105. As will be shown and described in more detail herein, the smart meter protection system 100 includes one or more redirection mechanisms (smart meter protection device 110, smart meter protection panel 120, and/or focuser unit 130) operably associable with the smart meter 105 to partially enclose the smart meter 105 so as to redirect radiation emitted from the smart meter 105 away from the interior of the building structure, living area, or where people frequent. The smart meter protection system 100 redirects some of the unwanted RF radiation emitted by the smart meter 105, decreasing the intensity of the radiation going into one's home from the smart meter and protecting the occupants of the home from the majority of RF radiation emitted from the smart meter while allowing the smart meter to perform its telemetering or communication functions. The smart meter protection system significantly reduces the level of RF radiation in the vicinity of the smart meter of the user, without interfering with communication quality. The smart meter protection system 100 also potentially prevents appliances/products/devices in one's home/structure from communicating with the smart meter 105.

In the embodiment of the smart meter protection system 100 shown with respect to FIGS. 1-24, the smart meter protection system 100 includes a smart meter protection device 110, a smart meter protection panel 120, and a focuser unit 130, each of which will be described in turn below.

The smart meter protection device 110 has a configuration housing like, but not limited to, a rectangular box with an open end 140. As shown best in FIG. 9, which is a top plan view of an exemplary panel layout of the smart meter protection device 110, the smart meter protection device 110 includes a main square panel 150, rectangular top/bottom panels 160, elongated rectangular flaps 170, elongated rectangular Velcro strips 175, end panel 180, trapezoid flaps 190, and an attached grounding wire 220. The various panels of the smart meter protection device 110 are connected by hinge lines as shown. The four panels 150, 160, 180 form four closed sides of the rectangular box configuration housing. One of two open sides of the rectangular box configuration housing accommodates the smart meter 105 and the other of the two open sides allows redirected radiation to egress there through away from the interior of the building structure, living area, or where people frequent while still allowing the utility company to receive their readings. In the preferred embodiment the smart meter protection device is grounded.

In an alternative embodiment the smart meter protection device forms a cylinder and can substitute for the focuser unit 130. The modified smart meter protection device may include section cutouts to tune the smart meter 105 to the target/desired specific RF frequency. It may also contain a lower lip to fully enclose the smart meter's 105 face and surface area 106.

In an embodiment, the smart meter protection device 110 is made of an aluminum composite material (solid polyethylene core with two pre-painted sheets of aluminum or similar material) called Dibond, which is registered trademark of 3A Composites USA of Mooresville, N.C. In alternative embodiments, the smart meter protection device 110 is made of conductive or dielectric material such as, but not limited to, metal, copper, aluminum, lead, nickel, and iron. In alternative embodiments, shielding material other than Dibond is used. In alternative embodiments other material comprised of a polymer layer within which RF attenuating particles are embedded is used. In an alternative embodiment the smart meter protection device is a cylinder. Holes 200 are provided in the end panel 180, top/bottom panels 160, and trapezoid flaps 190. Fasteners (e.g. bolts, rivets, screws, etc.) 210 are used to fasten the panels of the smart meter protection device 110 together. A grounding wire 220 is attached to the end panel 180 by a fastener 215 for grounding the smart meter protection device 110. In an alternative embodiment a grounding wire 220 is not attached.

Figure 9:
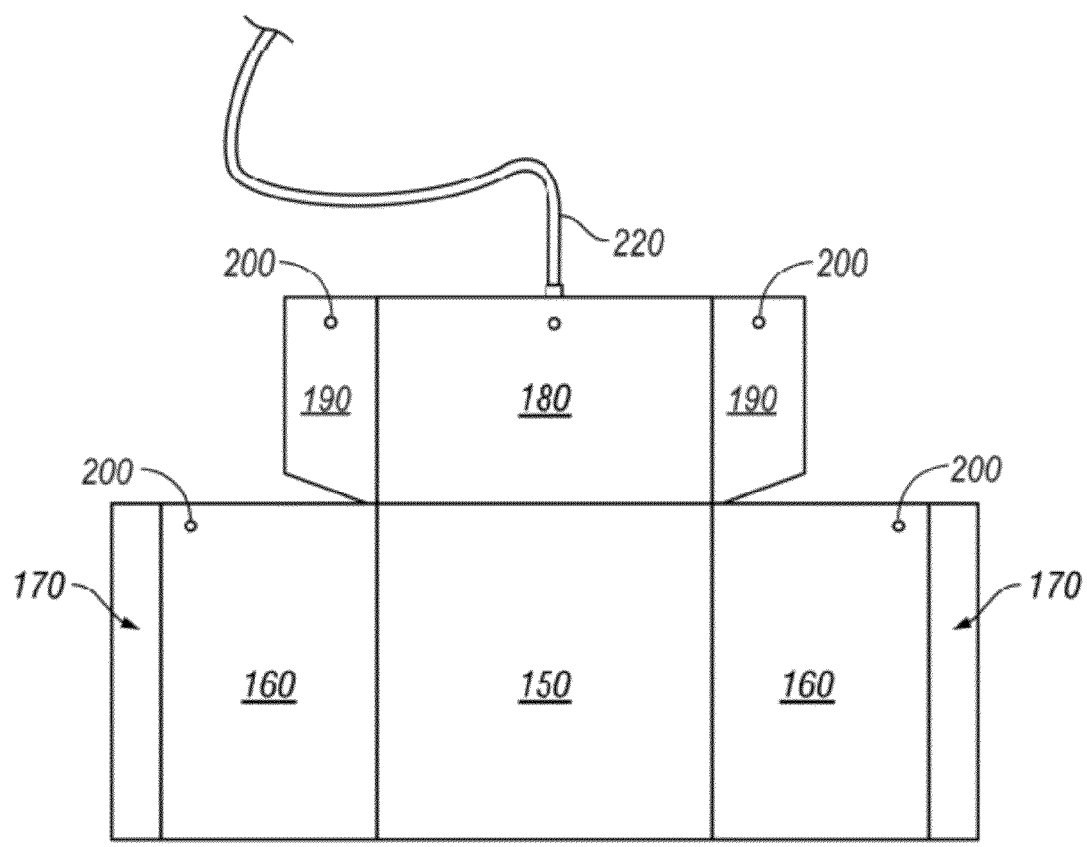
FIG. 9 is a top plan view of an exemplary panel layout of the smart meter protection device.
Figure 10:
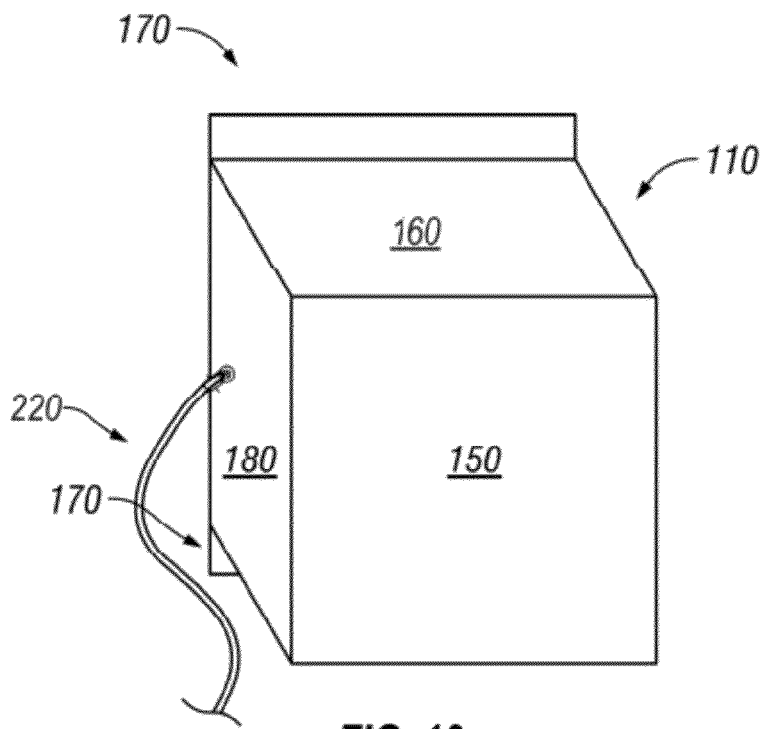
FIG. 10 is a perspective view of a smart meter protection device.
Figure 11:
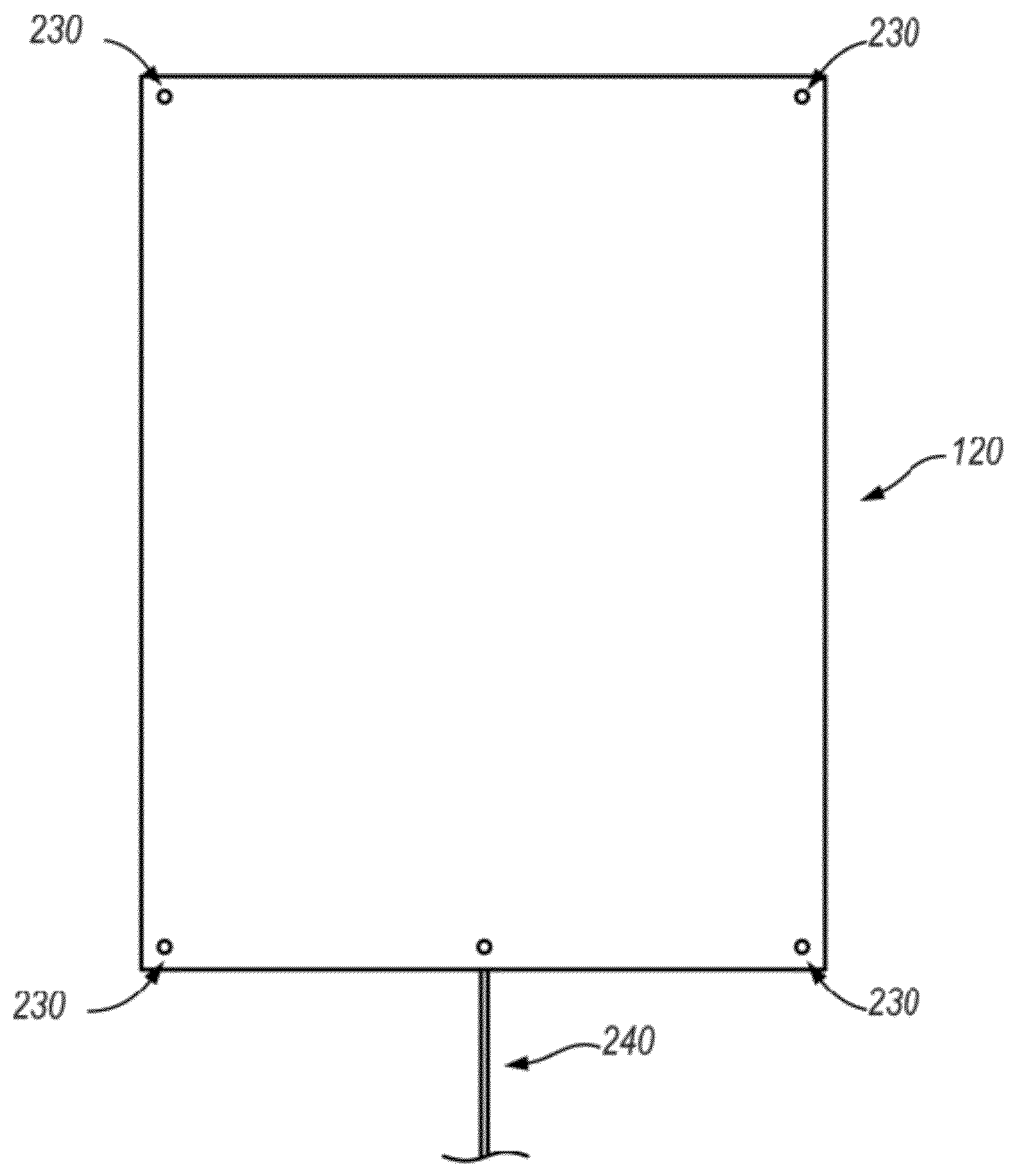
FIG. 11 is a front elevational view of a smart meter protection panel.
Figure 12:
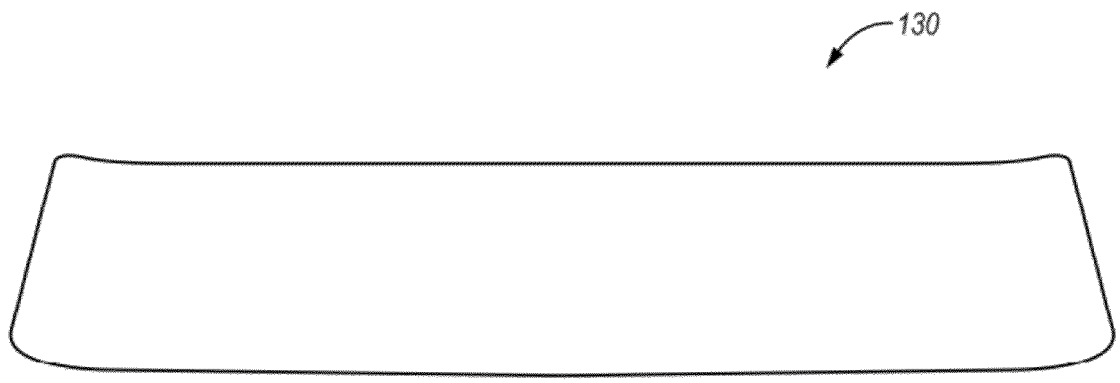
FIG. 12 is a front elevational view of an embodiment of an elongated piece of material that makes up a focuser unit of FIG. 14.
Figure 13:
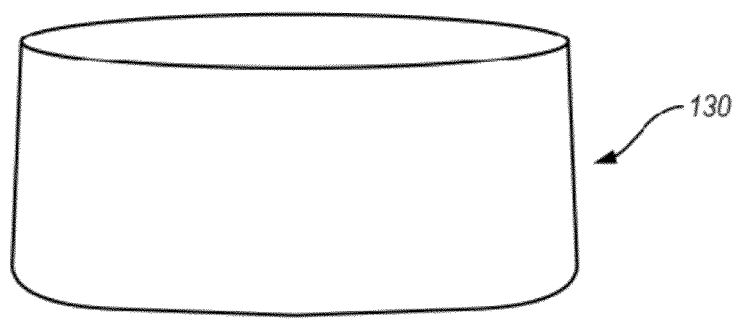
FIG. 13 is a front elevational view of the focuser unit of FIG. 14.
Figure 14:
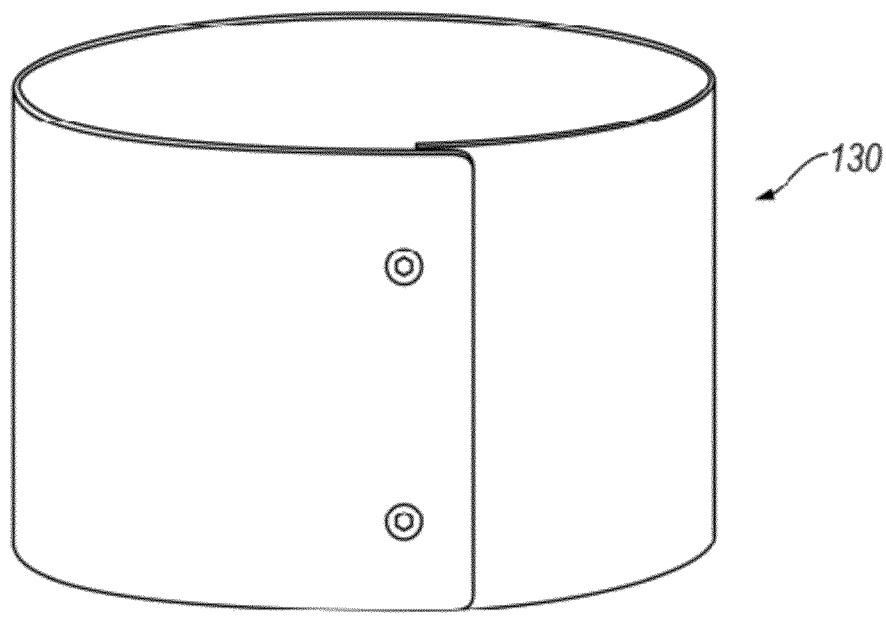
FIG. 14 is a front perspective view of a focuser unit.
Figure 15:
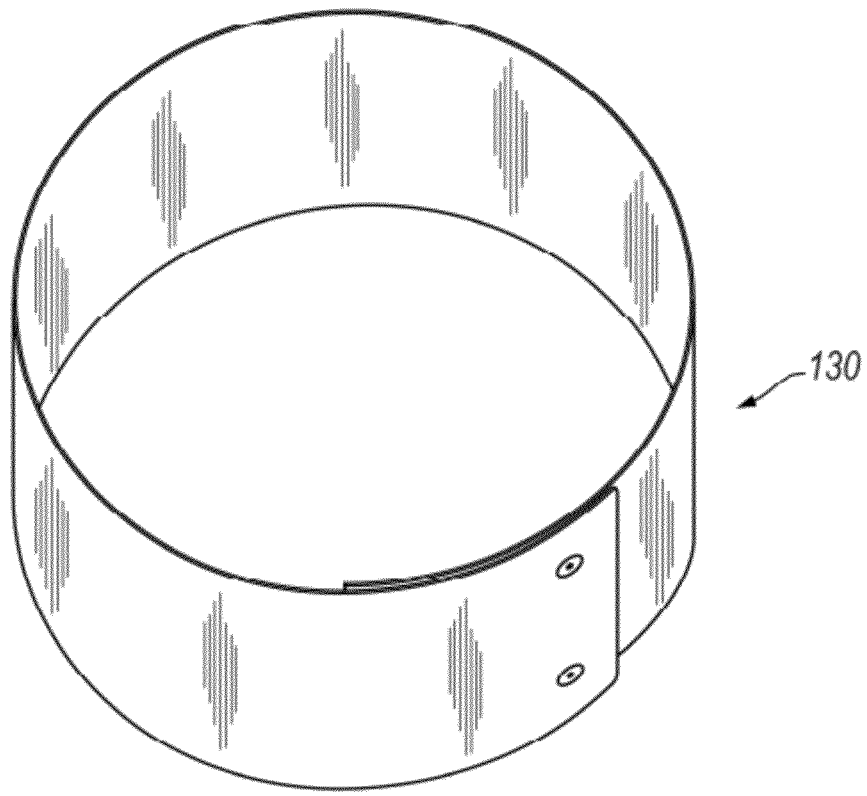
FIG. 15 is a front perspective view of another embodiment of a focuser unit similar to the focuser unit shown in FIG. 14.
Figure 16:
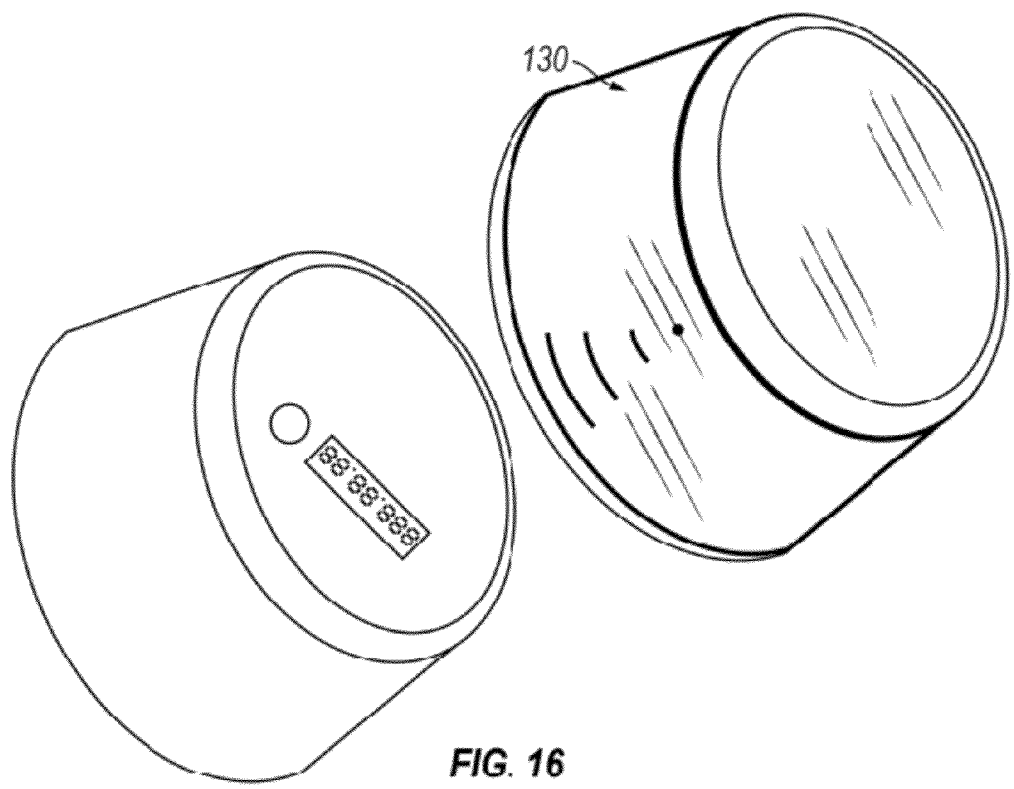
FIG. 16 is a perspective view of another embodiment of a focuser unit with the section cutouts manufactured into the smart meter.
Figure 17:
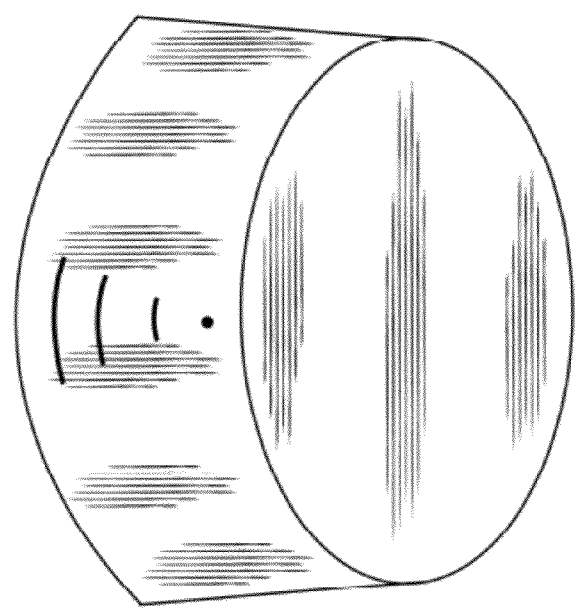
FIG. 17 is a front perspective view of another embodiment of a focuser unit with the section cutouts.
Figure 18:
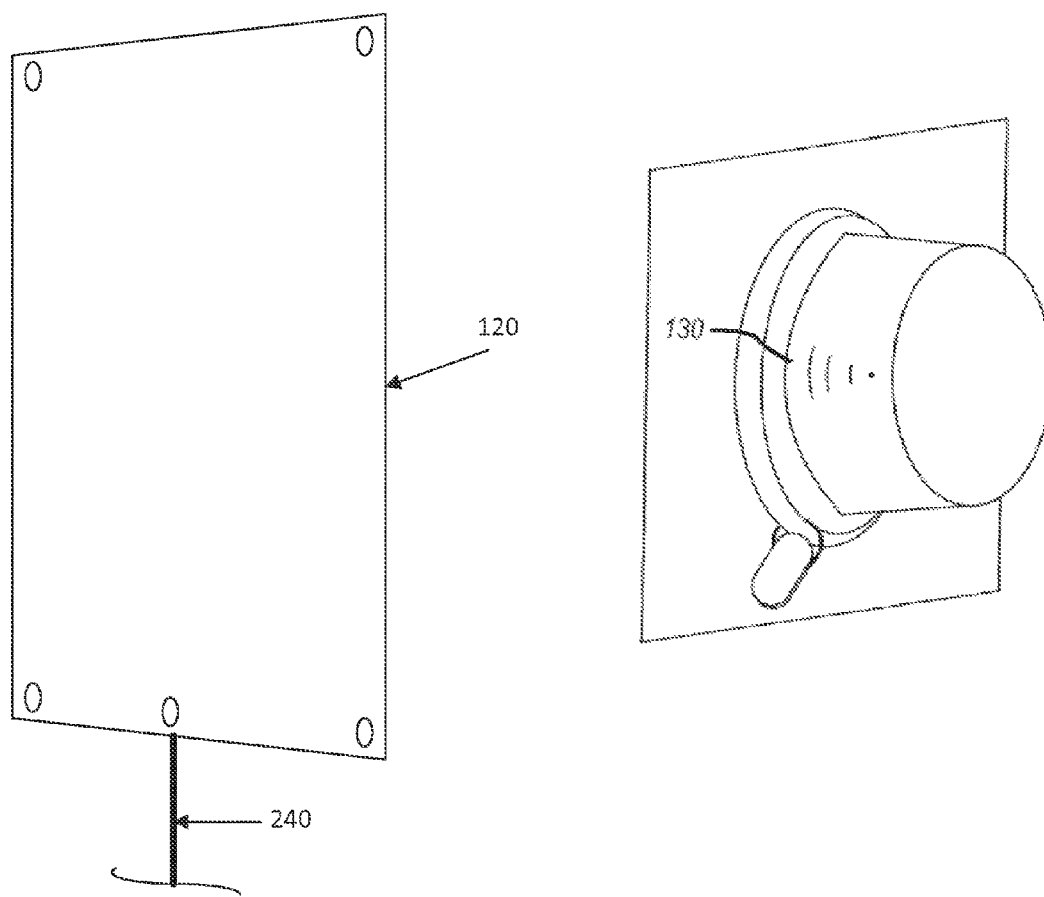
FIG. 18 is side elevational view of the focuser unit with the section cutouts embodiment shown in FIG. 17, shown applied over a smart meter, and shows a smart meter protection panel of the smart meter protection system directly behind the smart meter on the inside (e.g., indoors) of the home, garage, or other structure.
Figure 19:
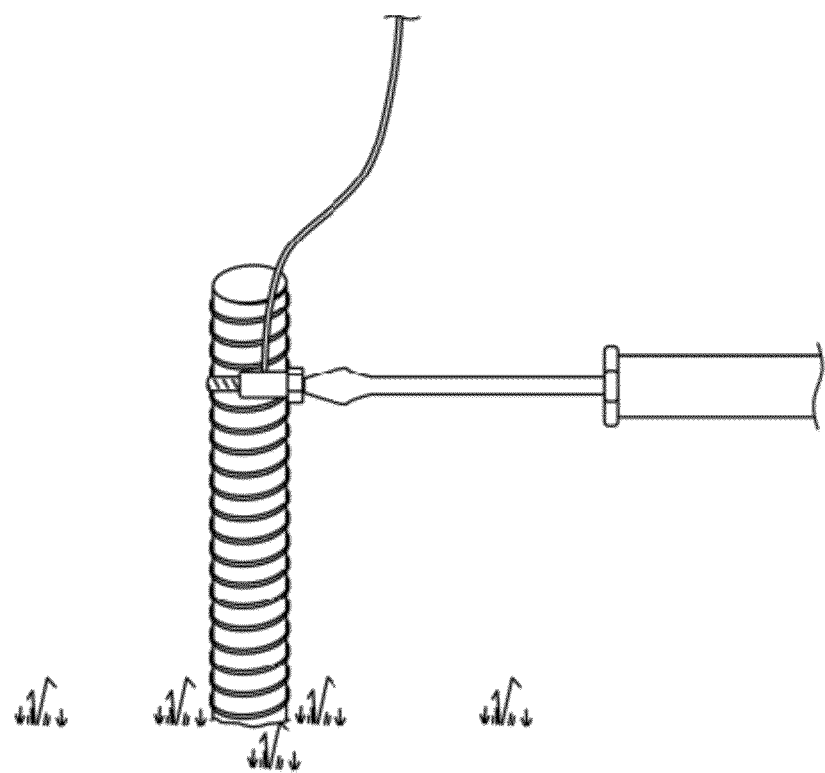
FIGS. 19 and 20 are perspective views showing, respectively, putting a grounding clamp on the metal rod or nearby water faucet and inserting the grounding wire into the side of the clamp and tightening.
Figure 20:
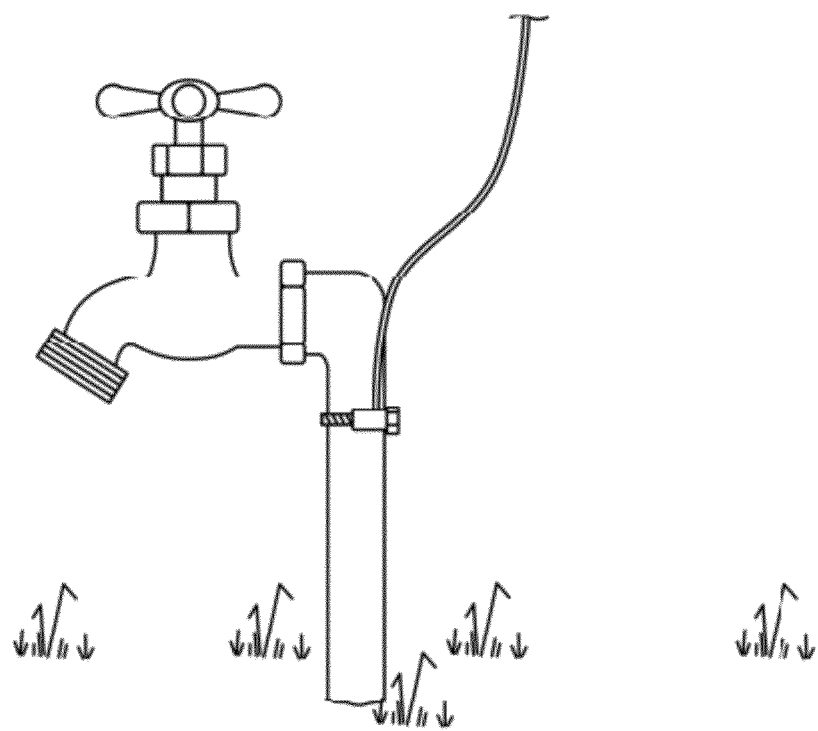
Figure 21:
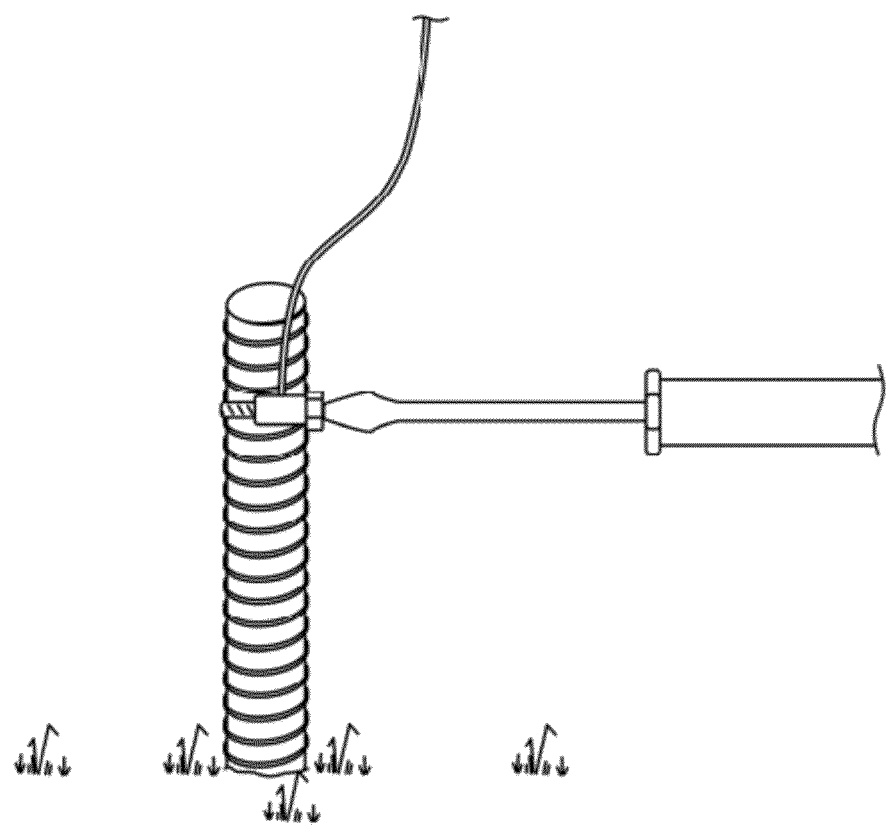
FIGS. 21 and 22 are a perspective view and a front elevational view, respectively, showing the grounding the wire of the smart meter protection panel to a grounded pole or a socket cover.

An exemplary method of making the smart meter protection device 110 includes cutting (e.g. routing, laser, machine) the metal material into the shape as shown in FIG. 9; forming the rectangular box configuration or cylinder housing; inserting rivets or fasteners into the holes; attaching a grounding wire; placing Velcro (hook and loop fasteners) or magnet on the elongated rectangular flaps 170 as shown. An exemplary method of making the smart meter protection device 110 includes mold injecting the desired shape and applying an attenuating conductive coating on the inside. Another exemplary method of making the smart meter protection device 110 includes mold injecting a conductive material into the desired shape or form.

As shown in FIGS. 1, 2, 11, 18, and 24, the smart meter protection panel 120 is a substantially flat rectangular panel with an attached grounding wire 220 and holes 230 in the corners for attaching the smart meter protection panel 120 to an interior of the building structure, living area, or where people frequent to inhibit transmission of radiation/wireless signals through the smart meter protection panel 120 and into the home. In the preferred embodiment the smart meter protection panel is grounded.

In an embodiment, the smart meter protection panel 120 is made of an aluminum composite material (solid polyethylene core with two pre-painted sheets of aluminum) called e-panel, which is a trademark of 3A Composites USA of Mooresville, N.C. In alternative embodiments, the smart meter protection panel 120 is made of conductive or dielectric material such as, but not limited to, metal, aluminum, nickel, iron, copper, and lead. In alternative embodiments, shielding material other than e-panel is used. In alternative embodiments other material comprised of a polymer layer within which RF attenuating particles are embedded is used. A grounding wire 240 (FIGS. 1,2,11,18,24) is attached to the smart meter protection panel 120 for grounding the smart meter protection panel 120. A grounding wire 240 is attached for grounding the smart meter protection panel 120. In an alternative embodiment a grounding wire 220 is not attached.

An exemplary method of making the smart meter protection panel 120 includes cutting (e.g. routing, laser, machine) metal material into rectangle, circle, square, etc.; inserting a grommet into all 4 corner holes; attaching a grounding wire 220 with a fastener. Another exemplary method includes attaching a grounding wire to an attenuating material to inhibit radiation/wireless signals emitted from the smart meter 105 from entering the home.

As shown in FIGS. 12-18, the focuser unit 130 is an aluminum annular band/cuff that circumferentially cuffs an outer ring-shaped periphery of the smart meter 105 in a ring-like fashion. The focuser unit 130 includes two open ends. One of the two open ends accommodates the smart meter 105 and the other of the two open ends allows redirected radiation to egress there through away from the interior of the building structure. The focuser unit 130 may include section cutouts to tune the smart meter 105 to the target/desired specific RF frequency. The section cutouts are based on the derivative of frequency and wavelength of the desired signal to redirect. The focuser unit 130 focuses RF emitted from the smart meter 105 towards an inside of the housing. The focused RF reflects off the inside of the housing and exits the smart meter protection device 110 through open end 140. The focuser unit 130 helps to decrease the intensity of the RF radiation being emitted by the smart meter 105 into the home and decreases the number and the frequency of the pulses based upon the network architectures. The focuser unit 130 also prevents radio waves from other smart meters 105 from relaying data to the smart meter 105 when the focuser unit 130 is installed In an embodiment, the focuser unit 130 is made of aluminum. In alternative embodiments, the focuser unit 130 is made of metal such as, but not limited to, aluminum, nickel, iron, copper, and lead. In alternative embodiments, shielding material other than aluminum is used. In an alternative embodiment, the focuser unit 130 includes one open end. In an alternative embodiment, the focuser unit 130 is grounded.

In an alternative embodiment, the focuser unit 130 contains a top and only contains one opening and tuning cutouts and may substitute for the smart meter protection device 110.

Instead of the case described above, the focuser unit 130 can be built into the smart meter (FIG. 16), alone, or in combination with a metallic or conductive shield, or in combination with the targeted frequency section cut outs, can be incorporated directly within the smart meters structure. The plastic/glass housing of the meter will be lined with a conductive metal layer and may include the section cutouts. This has the advantage that the smart meter is complete with the focuser unit/shield directly from the factory.

An exemplary method of making the focuser unit 130 includes cutting (e.g. routing, laser, machine) metal material into rectangle, circle, square, etc.; shaping the aluminum into a cylinder shape; inserting a fastener in the holes. An exemplary method of making the focuser unit 130 includes mold injecting the desired shape and applying an attenuating conductive coating on the inside. Another exemplary method of making the focuser unit 130 includes mold injecting a conductive material into the desired shape or form.

Figure 2:
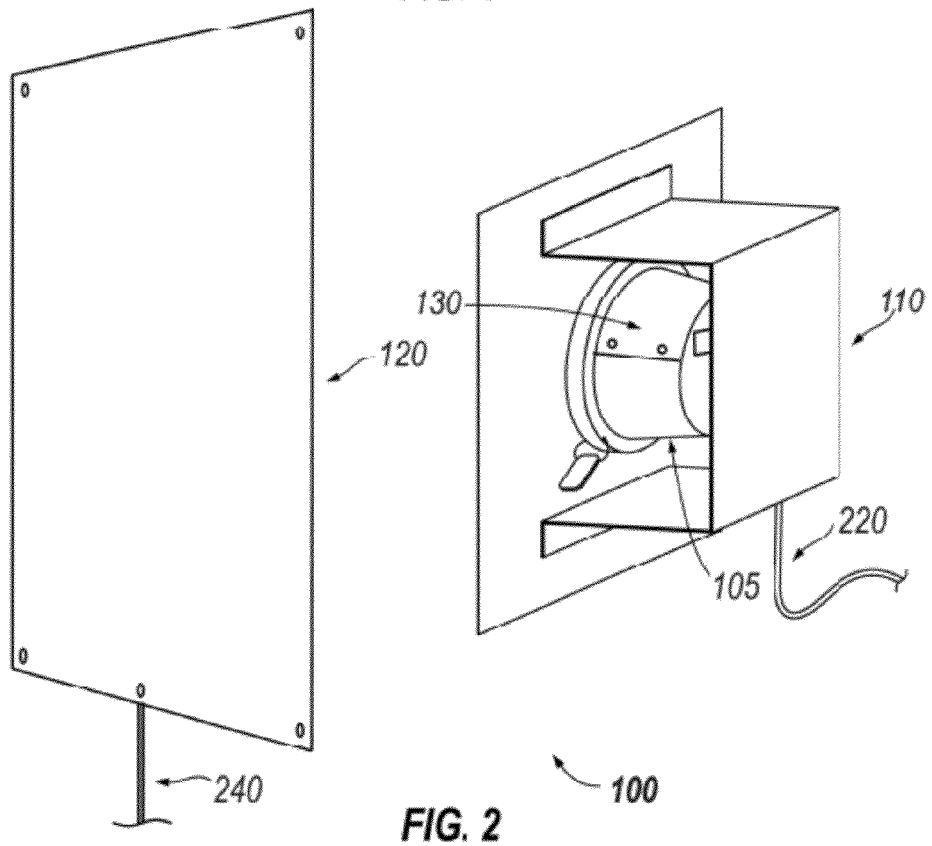
FIG. 2 is side elevational view of the smart meter protection system shown applied over a smart meter, and shows a smart meter protection panel of the smart meter protection system directly behind the smart meter on the inside (e.g., indoors) of the home, garage, or other structure.
Figure 3:
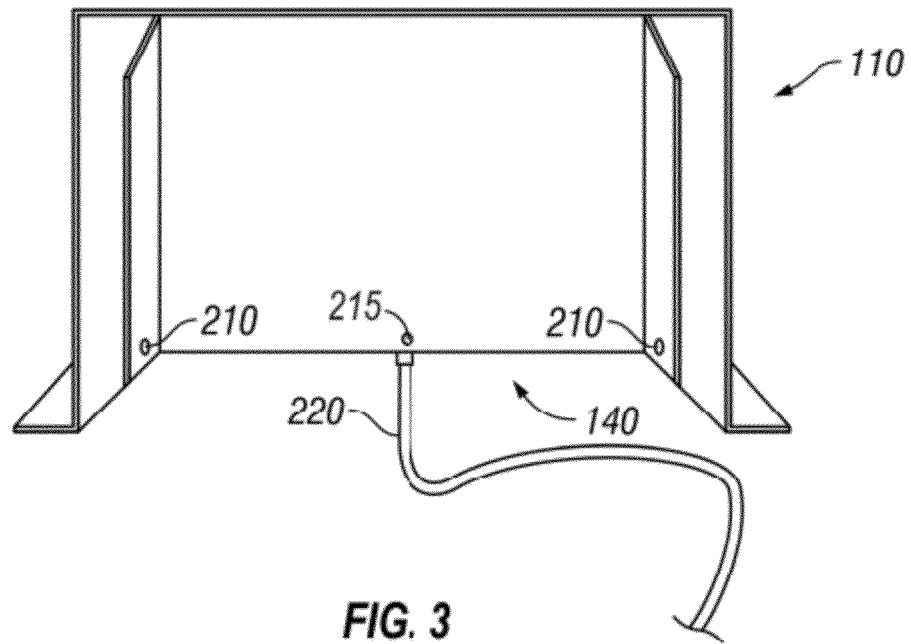
FIG. 3 is a front elevation view of the smart meter protection device of FIG. 10.
Figure 4:
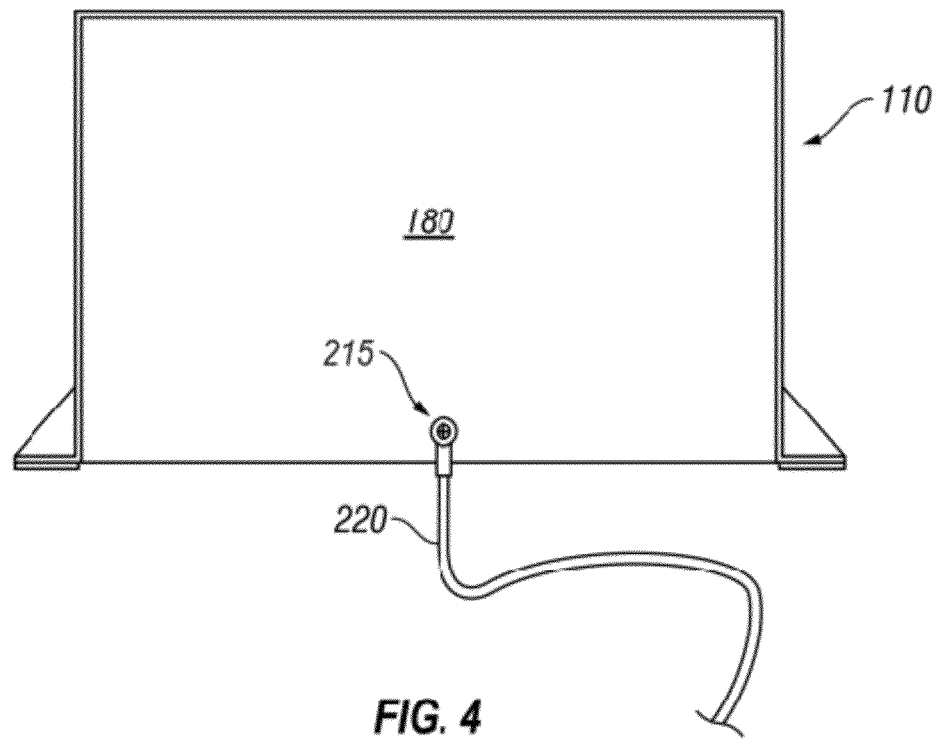
FIG. 4 is a rear elevation view of the smart meter protection device of FIG. 10.
Figure 5:
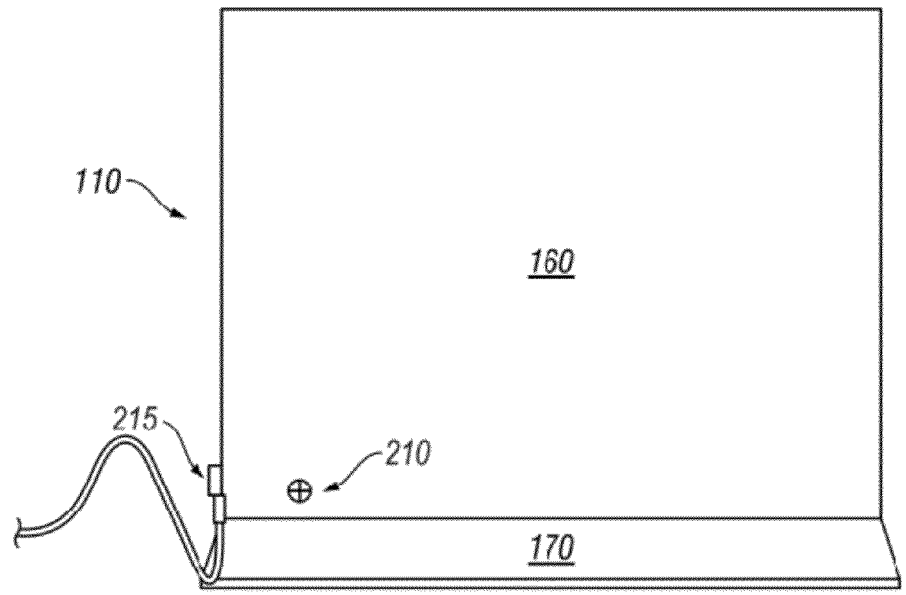
FIG. 5 is a left side elevation view of the smart meter protection device of FIG. 10.
Figure 6:
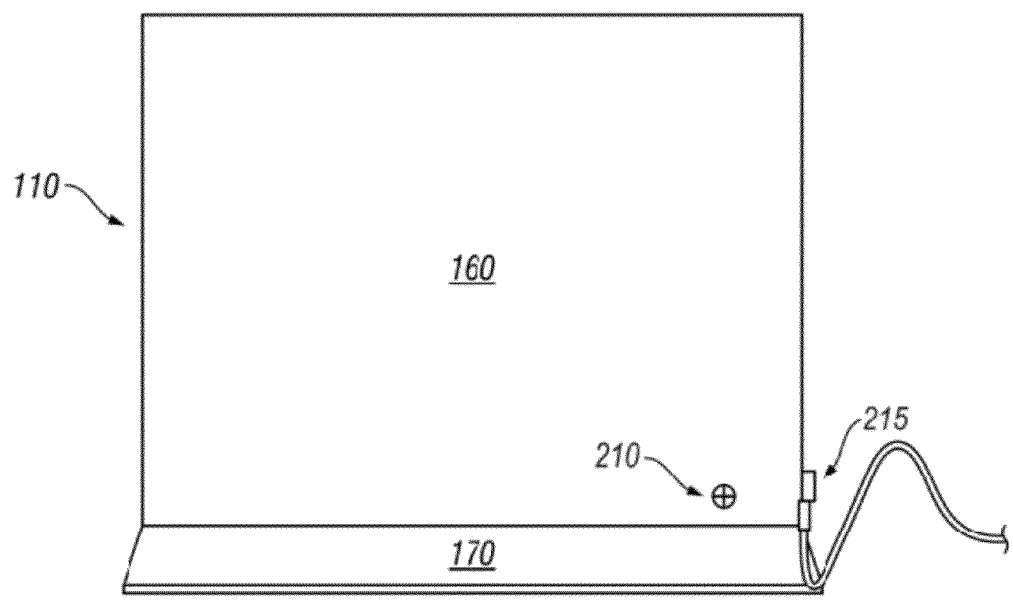
FIG. 6 is a right side elevation view of the smart meter protection device of FIG. 10.
Figure 7:
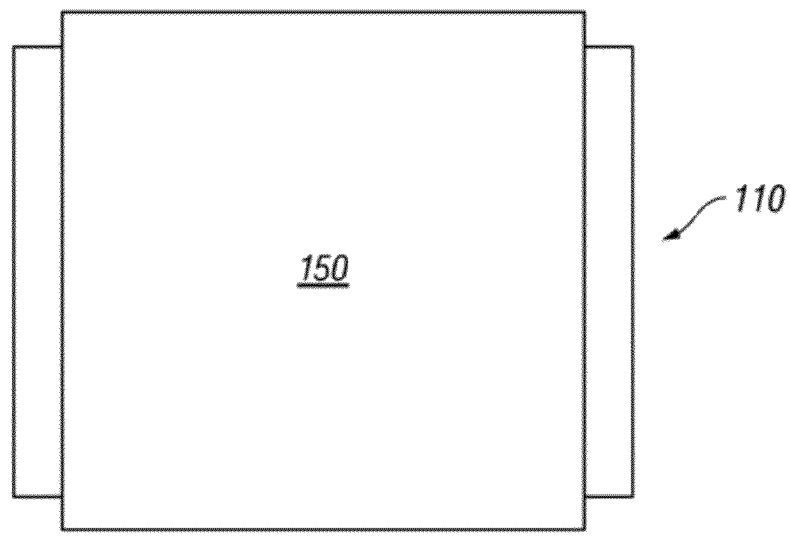
FIG. 7 is a top plan view of the smart meter protection device of FIG. 10.
Figure 8:
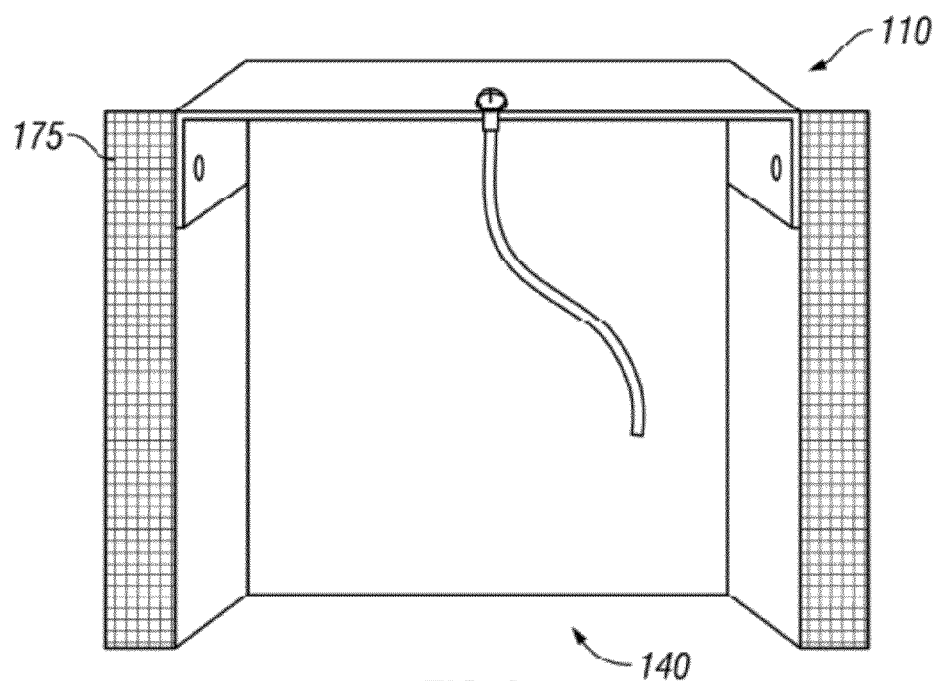
FIG. 8 is a bottom plan view of the smart meter protection device of FIG. 10.
Figure 22:
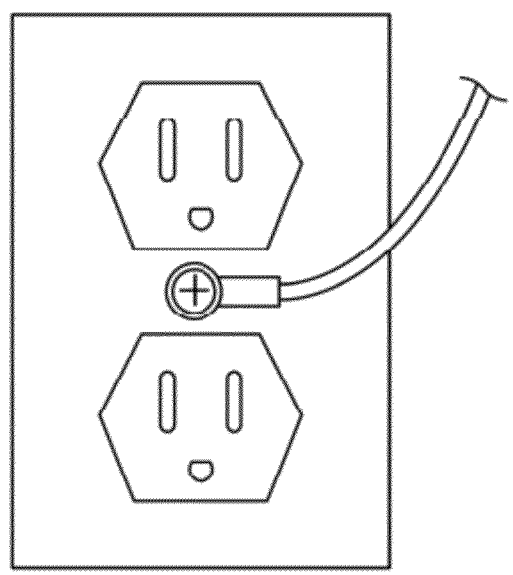
Figure 23:
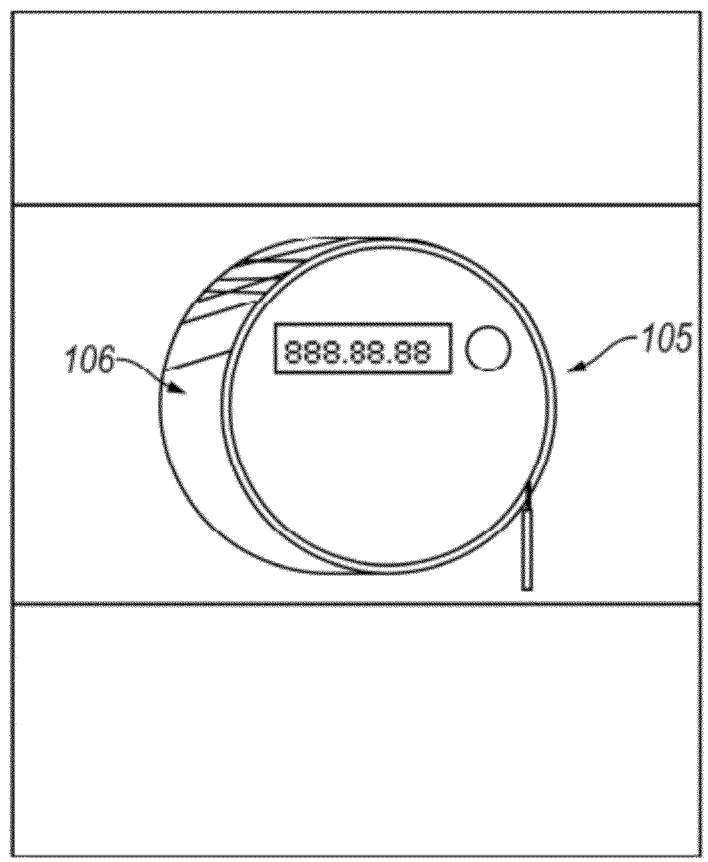
FIG. 23 is a perspective view of the smart meter.
Figure 24:
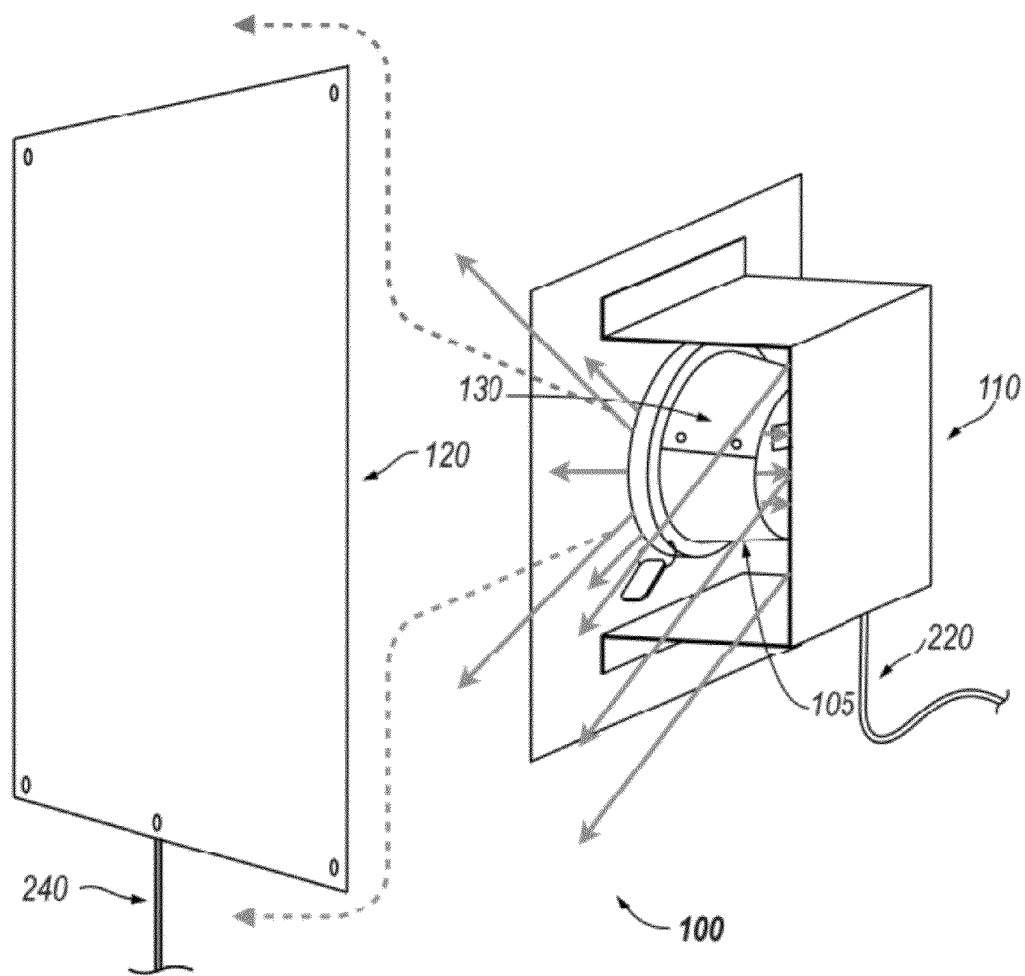
FIG. 24 is side elevational view of the smart meter protection system shown applied over a smart meter, and shows a smart meter protection panel of the smart meter protection system directly behind the smart meter on the inside (e.g., indoors) of the home, garage, or other structure; it exhibits how the RF energy is redirected by the smart meter protection system of FIG. 1.

With reference to FIG. 2, a method of applying the smart meter protection system 100 over a smart meter 105 includes locating smart meter outside of building structure, living area, or where people frequent and the area directly behind it inside; placing focuser unit 130 directly over smart meter 105 enclosing surface area 106; placing smart meter protection device 110 directly over the smart meter 105 with open side facing away from home or living area; ensuring the focuser unit 130 does not touch smart meter protection device once installed; grounding smart meter protection device 110 to a grounding method such as a metal rod inserted into ground (FIG. 19) (this could be rebar or copper pipe or fasten to an existing pipe in ground or nearby water faucet (FIG. 20); placing smart meter protection panel 120 (FIGS. 2, 11) directly behind smart meter 105 and securing it in place; grounding smart meter protection panel 120 to a grounding method such as a grounded pole outdoors (FIG. 21) or to the screw holding socket cover (FIG. 22).

In use, the smart meter protection system 100 provides a Faraday cage, Faraday shield or Hoffman Box for the smart meter 105. The smart meter protection system 100 redirects the unwanted RF energy emitted by the smart meter 105, decreasing the intensity of the radiation going into one's home from the smart meter and protecting the occupants of the home from the majority of RF radiation emitted from the smart meter while allowing the smart meter to perform its telemetering or communication functions. The smart meter protection system 100 decreases the intensity of the RF radiation being emitted by the smart meter 105 into the interior of building structure, living area, or where people frequent. The smart meter protection system 100 also prevents appliances/products/devices in one's home/structure from communicating with the smart meter 105.

While various embodiments of the present invention have been described above, it should be understood that they have been presented by way of example only, and not of limitation. Likewise, the various drawings/diagrams may depict an example architectural or other configuration for the disclosure, which is done to aid in understanding the features and functionality that can be included in the disclosure. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus the breadth and scope of the present invention, especially in any following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent.

As will become apparent to one of ordinary skill in the art after reading this document, the illustrated embodiments and their various alternatives can be implemented without confinement to the illustrated examples.

We claim:

1. A smart meter protection system for decreasing intensity of radiation going into one's home, building structure, or living area from a smart meter, the smart meter having an outer surface area, comprising: a redirection mechanism operably associable with the smart meter to partially enclose the smart meter so as to redirect radiation emitted from the smart meter away from the interior of the building structure, living area, or where people frequent, wherein the redirection mechanism includes a smart meter protection device.

2. The smart meter protection system of claim 1, wherein the redirection mechanism includes at least one of a smart meter protection panel and a focuser unit.

3. The smart meter protection system of claim 1, wherein the smart meter protection device includes a rectangular box configuration.

4. The smart meter protection system of claim 3, wherein the smart meter protection device includes four closed sides and two open sides.

5. The smart meter protection system of claim 4, wherein one of the two open sides accommodates the smart meter and the other of the two open sides allows redirected radiation to egress there through away from the interior of the building structure.

6. The smart meter protection system of claim 1, wherein the smart meter protection device includes at least one opening that allows redirected radiation to egress there through away from the interior of the building structure.

7. The smart meter protection system of claim 1, wherein the redirection mechanism includes a smart meter protection device and a smart meter protection panel.

8. The smart meter protection system of claim 7, wherein the smart meter protection panel is operably associable with the smart meter between the smart meter and the interior of the building structure to redirect the radiation emitted from the smart meter away from the interior of the building structure.

9. The smart meter protection system of claim 1, wherein the redirection mechanism includes a smart meter protection device, a smart meter protection panel, and a focuser unit.

10. The smart meter protection system of claim 1, wherein the redirection mechanism includes a focuser unit.

11. The smart meter protection system of claim 10, wherein the redirection mechanism is a focuser unit.

12. The smart meter protection system of claim 10, wherein the smart meter includes an outer periphery and the focuser unit is a band that is operably associable with the smart meter for directly surrounding the outer periphery of the smart meter in a ring-like fashion.

13. The smart meter protection system of claim 12, the band includes two open ends, and one of the two open ends accommodates the smart meter and the other of the two open ends allows redirected radiation to egress there through away from the interior of the building structure.

14. The smart meter protection system of claim 10, wherein the focuser unit includes at least one opening that allows redirected radiation to egress there through away from the interior of the building structure.

15. The smart meter protection system of claim 1, wherein the smart meter protection system includes a grounding wire to ground the smart meter protection system.

16. A method of using a smart meter protection system for decreasing intensity of radiation going into one's home from a smart meter, comprising:
    decreasing intensity of radiation going into one's home from the smart meter associated with the building structure, the smart meter having an outer surface area, comprising:
    providing the smart meter protection system of claim 1;
    operably associating the smart meter protection device with the smart meter so that smart meter protection device partially encloses the smart meter; and
    redirecting radiation emitted from the smart meter away from the interior of the building structure with the smart meter protection device.

17. The method of claim 16, wherein the redirection mechanism includes a smart meter protection panel and focuser unit, and operably associating includes operably associating the focuser unit with the smart meter so that the focuser unit encloses the outer surface area of the smart meter and the smart meter protection panel is operably associating with the smart meter between the smart meter and the interior of the building structure to redirect radiation emitted from the smart meter away from the interior of the building structure.

18. The method of claim 16, wherein the redirection mechanism includes a smart meter protection panel, and operably associating includes operably associating the smart meter protection panel with the smart meter between the smart meter and the interior of the building structure so that smart meter protection panel redirects the radiation emitted from the smart meter away from the interior of the building structure.

19. The method of claim 16, wherein the smart meter includes an outer periphery and the redirection mechanism includes a focuser unit that is a band, and operably associating includes directly surrounding the outer periphery of the smart meter in a ring-like fashion with the focuser unit so that the focuser unit partially encloses the outer surface area of the smart meter and redirects radiation emitted from the smart meter away from the interior of the building structure.

\* \* \* \* \*